(12) United States Patent
Patel et al.

(10) Patent No.: US 8,906,706 B2
(45) Date of Patent: Dec. 9, 2014

(54) METHOD OF FABRICATING A MASK STRUCTURE FOR PATTERNING A WORKPIECE BY IONS

(75) Inventors: Kanaiyalal C. Patel, Fremont, CA (US); Kurt A. Rubin, San Jose, CA (US)

(73) Assignee: HGST Netherlands B.V., Amsterdam (NL)

( * ) Notice: Subject to any disclaimer, the term of this patent is extended or adjusted under 35 U.S.C. 154(b) by 115 days.

(21) Appl. No.: 13/415,659

(22) Filed: Mar. 8, 2012

(65) Prior Publication Data

US 2013/0236987 A1  Sep. 12, 2013

(51) Int. Cl.
*H01L 21/00* (2006.01)

(52) U.S. Cl.
USPC ............... 438/3; 438/514; 438/526; 438/945; 257/E21.002; 257/E21.346; 427/526; 216/40; 156/60; 156/313

(58) Field of Classification Search
None
See application file for complete search history.

(56) References Cited

U.S. PATENT DOCUMENTS

| | | | |
|---|---|---|---|
| 4,655,875 A | 4/1987 | Wada et al. | |
| 6,753,043 B1* | 6/2004 | Kuo et al. | 427/526 |
| 6,864,042 B1* | 3/2005 | Kuo et al. | 430/320 |
| 7,488,429 B2 | 2/2009 | Okawa et al. | |
| 7,709,862 B2 | 5/2010 | Nonaka et al. | |
| 8,419,952 B2* | 4/2013 | Sakurai et al. | 216/22 |
| 8,481,339 B2* | 7/2013 | Nagahara et al. | 438/3 |
| 8,491,800 B1* | 7/2013 | Dorsey | 216/22 |
| 2009/0214898 A1 | 8/2009 | Hinoue et al. | |
| 2010/0053813 A1 | 3/2010 | Fukushima et al. | |
| 2010/0149680 A1 | 6/2010 | Ishibashi et al. | |
| 2010/0308012 A1 | 12/2010 | Yamamoto | |
| 2011/0058461 A1 | 3/2011 | Fukushima | |
| 2011/0132752 A1 | 6/2011 | Shirotori et al. | |
| 2011/0212270 A1 | 9/2011 | Uchida | |
| 2012/0292285 A1* | 11/2012 | Kontos et al. | 216/12 |

FOREIGN PATENT DOCUMENTS

WO   2011004761 A1   1/2011

\* cited by examiner

*Primary Examiner* — Zandra Smith
*Assistant Examiner* — Khanh Duong

(57) ABSTRACT

A method of fabricating workpieces includes one or more layers on a substrate that are masked with an ion implantation mask comprising two or more layers. The mask layers include a first mask layer closer to the substrate, and a second mask layer on the first mask layer. The method also comprises ion implanting one or more of the layers on the substrate. Ion implantation may form portions with altered physical properties from the layers under the mask. The portions may form a plurality of non-magnetic regions corresponding to apertures in the mask.

27 Claims, 3 Drawing Sheets

METHOD OF FABRICATING A MASK STRUCTURE FOR PATTERNING A WORKPIECE BY IONS

BACKGROUND OF THE INVENTION

1. Field of the Disclosure

The present invention relates in general to a mask structure that enables patterning small features on a workpiece using ions and, in particular, to a system, method and apparatus for a mask structure for ion implant magnetic patterning of magnetic media disks for disk drives.

2. Description of the Related Art

Patterning is part of the fabrication process used to create small features to build devices that process and store information. Ion bombardment or ion implantations are methods that are used for patterning. Ions are directed to impinge upon a sample thru a mask that has openings which can be used to pattern a sample. The ions locally change the properties of regions where they pass through or are stopped. The patterning can be in the form of changes to the local physical properties of the sample including microstructural, magnetic or electrical properties.

Ion implant tools are capable of generating the doses of ions that are needed to adequately change physical properties. There are a number of different kinds of implanting tools including plasma and ion beam implanters. High doses of ions are provided by these tools. However, it is necessary to develop new mask structures to enable the use of higher ion doses since masks that are exposed to an environment of high doses of ions or ions with higher masses can be partially susceptible to unwanted damage of the mask material. The damage can be in the form of thinning of the mask. If the mask is too thin, it can no longer perform its function of adequately stopping ions from entering the materials below the mask.

One cause of mask thinning is sputter etching of the mask material during the course of the implantation process. As the dose of implanting ions is increased, the amount of thinning correspondingly increases, to the point where conventional mask structures for ion implantation are not adequately robust against ion-induced erosion unless they are thick.

Unfortunately, the use of thick mask layers poses a number of challenges. As the size of the features to be patterned is made more narrow, the mask correspondingly has to be narrower. Relatively narrow and tall mask structures are mechanically weaker and prone to topple, creating defects in the patterned workpiece. Thicker masks also are less favored for manufacturing reasons. Mask structures are often deposited by vacuum deposition techniques and it can take more time to deposit a thicker mask, which adds undesired manufacturing cost. Thus, improvements in masks for ion implant magnetic patterning of workpieces continue to be of interest.

One method of reducing the sputter-induced erosion of the mask material is to make the mask out of a material having a lower tendency to be sputter-etched by the implanting ions. Sputter-etching means that the incident ions collide with the ions of the mask material and by transfer of energy and momentum cause the mask atom to be ejected from the mask. Repetition of the ejection of mask ions leads to sputter erosion or thinning of the mask material.

An example of a material that can be formed into a mask with a lower sputter rate is to fabricate the mask of a material that includes carbon. Carbon can be fabricated to have very low sputter erosion rates compared to many other materials. However, if used on its own as a mask material, carbon must be relatively thick to adequately stop the ions before they reach the layer to be patterned on the workpiece. It is desirable to make the mask thin. A way to make a thinner mask that initially stops the ions is to make the mask out of a material with good ion stopping power. However, many materials with good stopping power are very susceptible to high rates of sputter erosion. So again, a large thickness of the high stopping power material would be required to adequately stop the ions. What is needed is a mask structure that adequately stops ions, is subject to relatively small rates of erosion, does not need to be excessively thick, and can be fabricated readily for manufacturing.

SUMMARY

Embodiments of a system, method and apparatus for fabricating workpieces are disclosed. One or more layers on a substrate are coated with a set of mask materials comprising two or more layers. The mask layers include a first mask layer closer to the substrate, and a second mask layer on the first mask layer.

The mask layers are then patterned to create a set of openings. Those openings reach substantially through the mask layers. A number of techniques can be used to create those patterns. One embodiment involves imprinting a patterned resist on the mask structure. The adhesion of the imprinted resist may be enhanced by applying an adhesion promoter. In some cases one or more transfer layer(s) is(are) deposited on the top mask layer prior to depositing the imprint resist adhesion promoter. A series of reactive ion etch (RIE) processes may be applied to the structures, starting with the imprint resist in order to create the openings or apertures in the mask. For instance, a first RIE process is used to de-scum or remove the bottom layer of imprint resist that may be a few nm thick as well as the adhesion promoter. A second RIE process then may be used to create openings in the transfer layer. The transfer layer might be $SiO_2$ in one embodiment. During the opening of the holes in the transfer layer, the imprint resist is partially eroded but enough of it remains to complete the opening of holes in the transfer layer. Then a different RIE process may be used to open holes in the top layer of the mask structure. Then a different RIE process may be used to open holes in the bottom mask layer. This last RIE process is designed to not etch into the stop layer. Alternatively, if no stop layer is present, the etching process is designed to minimally etch into the magnetic material that is to be patterned.

The method also comprises ion implanting one or more layers of materials that lie physically located between the first mask layer and the substrate. Ion implantation may form portions with altered physical properties from the layers under the mask. The portions may form a plurality of non-magnetic regions corresponding to apertures in the mask.

The foregoing and other objects and advantages of these embodiments will be apparent to those of ordinary skill in the art in view of the following detailed description, taken in conjunction with the appended claims and the accompanying drawings.

BRIEF DESCRIPTION OF THE DRAWINGS

So that the manner in which the features and advantages of the embodiments are attained and can be understood in more detail, a more particular description may be had by reference to the embodiments thereof that are illustrated in the appended drawings. However, the drawings illustrate only some embodiments and therefore are not to be considered limiting in scope as there may be other equally effective embodiments.

The use of the same reference symbols in different drawings indicates similar or identical items.

DETAILED DESCRIPTION

Embodiments of a system, method and apparatus for fabricating a method patterned workpiece with an improved mask structure are disclosed. For example, the workpiece comprises a magnetic medium of a magnetic memory device, a flexible tape substrate, a magnetoresistive random access memory (MRAM) device, a phase change memory, a semiconductor, flash memory, or a dynamic random access memory (DRAM).

One application of the improved mask structure enables ion implantation to form patterns on magnetic disks for high areal density magnetic recording on bit-patterned magnetic media. This creates a patterned mask on a thin film magnetic layer and then exposes that pattern to the ions. The areas where the mask is present blocks the ions. The regions where the mask material has been removed to form apertures allow the ions to penetrate into a magnetic layer of the workpiece, causing changes to the magnetic properties in the region where the ions have penetrated. Those changes in magnetic properties may be accompanied by a microstructural change. The microstructural change may be amorphization of the initially crystalline magnetic material in the regions exposed to the ions. Alternatively, the final implanted state may be crystalline with defects. The chemical composition of the implanted region will be different from the non-implanted regions since the ions that come to rest in the implanted regions change the chemical stoichiometry.

Figure 1:
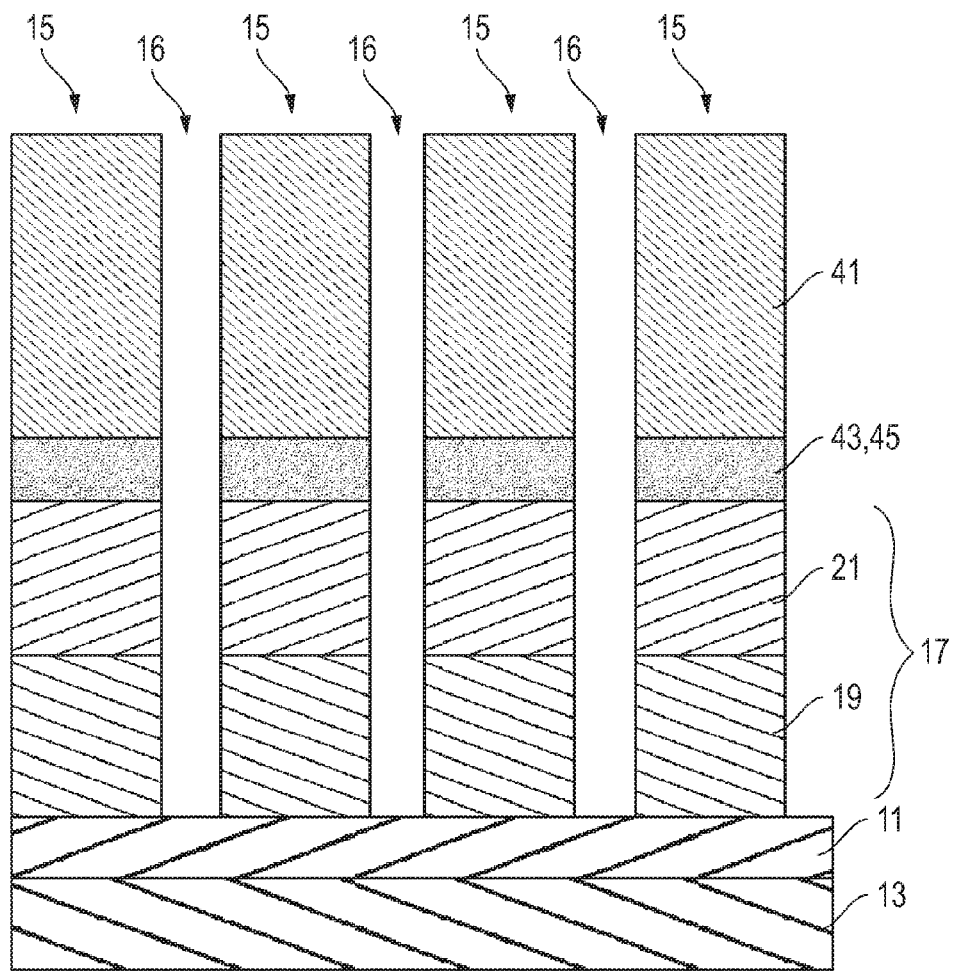
FIGS. 1-3 are schematic sectional side views of embodiments of workpiece fabrication processes.

As shown in FIG. 1, an embodiment of a method may comprise providing one or more layers 11 (e.g., a magnetic layer(s)) on a substrate 13. The method includes masking portions 15 of a layer furthest from the substrate 13 with an ion implantation mask 17 comprising two or more layers. The mask 17 may have a total thickness of about 5 nm to about 70 nm. In some versions, the mask 17 consists of a bi-layer of the first mask layer 19 and the second mask layer 21.

The mask layers include a first mask layer 19 closer to the substrate 13, and a second mask layer 21 on the first mask layer 19 and further from the substrate 13. The first mask layer 19 may comprise a metal selected from the group consisting of Mo, W and Cr. The second mask layer may comprise carbon, and the carbon may contain elements selected from H or N. For example, the second mask layer 21 may comprise filtered cathodic carbon (FCAC), facing-target deposited carbon, confined dense plasma source (CPS) carbon, diamond-like carbon (DLC) or amorphous carbon. The second mask layer may also comprise silicon, or silicon doped with other elements such as oxygen or nitrogen. The second mask layer may also comprise titanium or titanium doped with other elements such as nitrogen. Each of the first and second mask layers 19, 21 may have a thickness of about 1 nm to about 40 nm.

Figure 2:
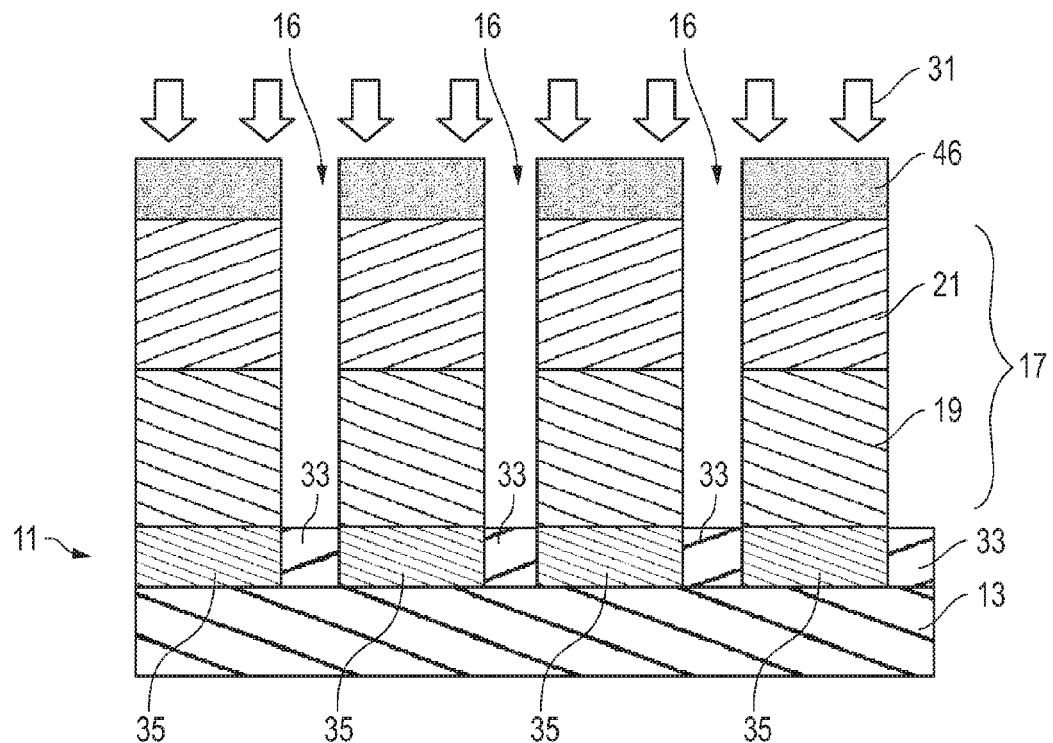

The method also comprises ion implanting 31 (FIG. 2) one or more of the layers 11 on the substrate 13. The implanting ions may comprise arsenic, antimony, phosphorous, chromium, gallium, boron or nitrogen. A dose of the ion implanting may be about $0.1 \times 10^{16}$ ions/cm$^2$ to about $3 \times 10^{16}$ ions/cm$^2$, or about $1 \times 10^{16}$ ions/cm$^2$ to about $2 \times 10^{16}$ ions/cm$^2$.

Ion implantation may form portions 33 with altered physical properties (e.g., such as magnetic properties) from the layers 35 under the mask 17. Portions 33 may form a plurality of non-magnetic regions corresponding to a plurality of apertures 16 in the mask 17. The mask 17 may cause patterning in the one or more of the layers 11 on the substrate 13. Widths of the portions 33 with altered physical properties may range from about 1 nm to about 100 nm, or about 2 nm to about 25 nm. The portions 33 with altered physical properties may have a thickness about 2 nm to about 25 nm or larger. A residual layer 46 (e.g., $SiO_2$, SiN, etc.) also may be formed on second mask layer 21. In addition, there may be an additional layer (not shown) between layers 19 and 21. One purpose of this additional layer may be to facilitate the patterning process of layer 19. The additional layer may comprise $SiO_2$, SiN, or other materials. In some embodiments, portions of the workpiece layer may have a thickness of about 2 nm to about 25 nm, and a width of at least about 1 nm to about 100 nm, or about 2 nm to about 25 nm.

The method may further comprise a patterned resist layer such as an imprint resist layer 41 (FIG. 1) beyond the second mask layer 21. In still other embodiments, an adhesion layer 43 may be located between the resist layer 41 and the second mask layer 21. Alternatively, a pattern transfer layer 45 may be located between the resist layer 41 and the second mask layer 21.

Figure 3:
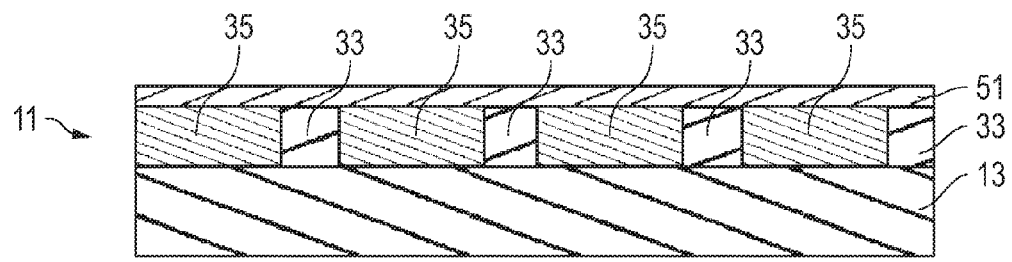

The method may further comprise one or more reactive ion etch (RIE) steps to substantially remove any residual imprint layer 46 (FIG. 2) and the mask 17 after ion implantation 31 is completed (FIG. 3). The final structure may be coated with a protective overcoat 51.

Figure 4:
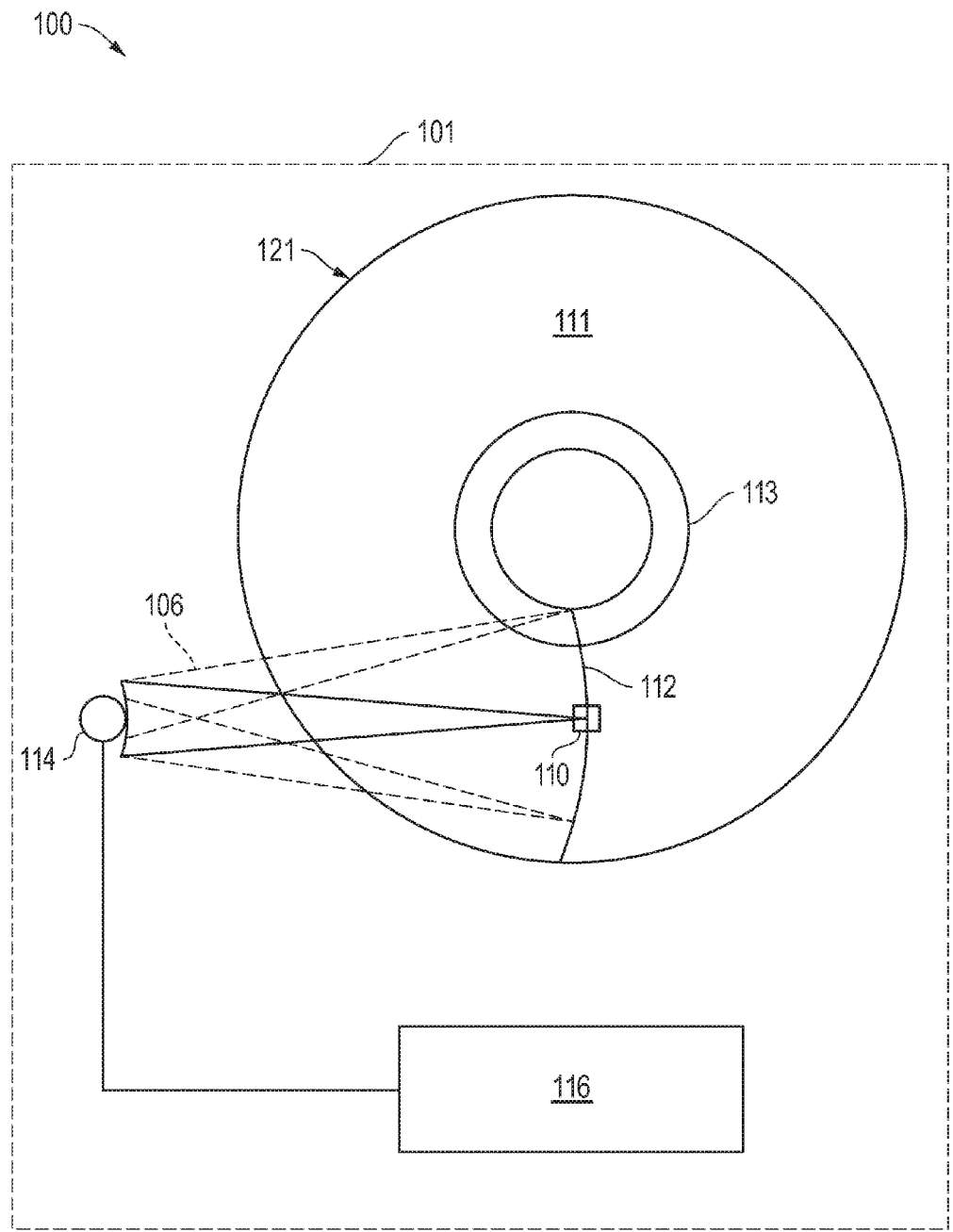
FIG. 4 is schematic plan view of an embodiment of a disk drive.

FIG. 4 depicts a hard disk drive assembly 100 comprising a housing or enclosure 101 with one or more media disks 111 rotatably mounted thereto. The disk 111 comprises magnetic recording media rotated at high speeds by a spindle motor (not shown) during operation. Disk 111 may be configured as described elsewhere herein.

Magnetic data tracks 113, which may be concentric, are formed on either or both of the disk surfaces to receive and store information. The tracks are formed by the creation of bit-patterned islands with one magnetic property which are surrounded by material with a different magnetic property. The bit patterned islands constitute the regions of the disk that were originally protected by the mask. The regions surrounding the bit-patterned magnetic islands were exposed to the implanting ions by the presence of the apertures in the mask that allowed the incident ions to reach the magnetic layer rather than being stopped as they are in the layers constituting the mask. After implanting is completed, the mask is removed or stripped off of the workpiece. The implanting and mask strip processes are designed to minimize recession or protrusion of the top surface of the implanted region relative to the non-implanted region. A recession of less than 3 nm is preferred and a protrusion of less than 2 nm is preferred to enable the read-write head to fly with higher precision and closer to the magnetic recording layer. The one or more protective layers may be deposited on the magnetic layer after stripping the mask. The protective layers are used to prevent corrosion and to allow a lubricant layer to be coated on the disk.

Although the first mask layer is closer to the substrate than the second mask layer, embodiments have additional layers between the first mask layer and the one or more layers that are being patterned. For instance, it can be advantageous to have an etch stop layer deposited on the magnetic layer. The etch stop layer may be $SiN_x$ or $SiO_x$, but other materials can also be used. The thickness of that etch stop layer may be between 0.5 and 5 nm. The etch stop layer is used during the mask processing to stop the RIE gases from damaging the magnetic layer during the etching of the apertures in layer 21 (e.g., tungsten or other material).

The magnetic properties of the workpiece layer can be altered from a somewhat ordered crystalline state to a more effective state including to an amorphous state by sufficient exposure to ions. The ions disrupt the crystalline microstructure, shifting the atoms from their initial somewhat ordered crystalline state into a more disordered amorphous state. If the ions are of sufficiently low energy, many of them will come to rest in the work piece layer. If they are higher energy, they cause disorder during their traversal through the layer of the workpiece and then continue on stopping in lower layers of the workpiece or penetrating into the substrate.

The ions are incident on the target. The target comprises the mask layer furthest from the workpiece and it also comprises the portions of the workpiece that lie below the apertures in the mask. The mask structure and ion implant conditions are selected so as to maximize stopping of the ions that enter the mask, in the mask before they reach the workpiece and to stop the majority of ions that enter the workpiece through the aperture in the workpiece.

The ions may be implanted by a number of different devices including plasma ion implanters and beam-line implanters. The ions may be incident with a relatively narrow energy or angular distribution or a relatively broad energy and angular distribution. Once the ions hit the target material, the energy of the ions is reduced by a progressive implantation process has a distribution of ion energies, penetration distances and lateral positions With each collision, the trajectory of the implanting ion is changed. This leads to a distribution of final positions in which the ions come to rest. This distribution is called straggle. There is a longitudinal straggle which is a measure of the range of ion positions into the thickness of the target. There a lateral straggle which is a measure of the lateral distribution of position of the ions that have come to rest in the target.

Although the highest concentration of ions lies below the apertures, because of lateral straggle, some of the ions that are incident thru the aperture will end up below the mask regions between the apertures. In addition, a small percentage of the ions are scattered out of the mask and into the workpiece layer.

In some embodiments, a method of fabricating a mask structure comprises providing a mask comprising two or more film layers; providing a first mask layer having a first etch rate from exposure to ions incident on it; providing a second mask layer having a second etch rate that is lower than the first etch rate from exposure to ions incident on it; and providing apertures through portions of the first and second mask layers to provide a patterned mask structure.

The method may further comprise putting the patterned mask structure on a workpiece comprising one or more film layers on a substrate; and the first mask layer is closer to the both the workpiece and the substrate than the second mask layer. The patterned mask structure may be on a layer of the workpiece, portions of the workpiece layer are under the apertures, and implanting ions in the portions of the workpiece layers to alter physical properties of the portions of the workpiece layer. The portions of the workpiece layer may have a thickness of about 2 nm to about 25 nm, and a width of at least about 2 nm to about 25 nm, and the width of the portions of the workpiece layer may be at least about 2 nm to about 25 nm. The portions of the workpiece layer below the apertures may have a higher concentration of implanting ions compared to portions of the workpiece layer between the apertures. An atomic concentration of ions implanted in the portions of the workpiece layer below the apertures may be between 0.1 at % and 10 at %. The implanted ions may comprise one or more of As, Sb, P, Cr, Ga, B, O and N.

In addition, the portions of the workpiece layer with higher concentrations of implanted ions may have more defects than portions with lower doses of implanted ions. The portions of the workpiece layer with higher concentrations of implanted ions may be amorphous and other portions of the workpiece layer have lower doses of implanted ions and are crystalline. The one or more film layers on the substrate may comprise a magnetic layer, and the implanted ions may alter magnetic properties of the portions of the magnetic layer to form a plurality of non-magnetic regions corresponding to the apertures in the patterned mask structure.

The workpiece may comprise a magnetic medium of a magnetic memory device, a flexible tape substrate, a magnetoresistive random access memory (MRAM) device, a phase change memory, a semiconductor, flash memory, a dynamic random access memory (DRAM).

The method may further comprise one or more reactive ion etch (RIE) steps to remove the patterned mask structure after ion implantation is completed. A pattern transfer layer may be located between the first and second mask layers and the thickness of the pattern transfer layer is between about 0.2 nm and about 20 nm. The pattern transfer layer may comprise Cr, Si, O, N, $SiO_x$, or $SiN_x$. A total thickness of the patterned mask structure may be about 4 nm to about 70 nm, and each of the first and second mask layers may have a thickness of about 1 nm to about 40 nm.

The first mask layer may contain atoms that have a first atomic number and a first atomic mass, and the second mask layer contains atoms that have a second atomic number and a second atomic mass that are lower than the first atomic number and the first atomic mass, respectively. The first mask layer may comprise a metal selected from the group consisting of W, Mo and Cr. The second mask layer may comprise C, and the C contains at least one additional element. The second mask layer may comprise C and at least one of H and N. The second mask layer may comprise Si and at least one of O and N, or the second mask layer may comprise one or more of Ti, N and O. The second mask layer may comprise filtered cathodic carbon (FCAC), facing-target deposited carbon, confined dense plasma source (CPS) carbon, diamond-like carbon (DLC) or amorphous carbon.

The method may further comprise an imprint resist layer beyond the second mask layer, or an adhesion layer between the imprint resist layer and the second mask layer; or one or more pattern transfer layers between the imprint resist layer and the second mask layer. For some geometries, the resist does not have adequate robustness to directly pattern the first and second mask layers. In that case one or more pattern transfer layers may be used to implement this invention. The pattern transfer layers may comprise a bilayer of SiOx on Cr where the bilayer of SiOx and chrome lies between the resist layer and second mask layer. The resist defines the pattern. A RIE process may be used to descum the base of the openings that are patterned in the resist. A different RIE process may be used to open apertures in the SiOx layer. A different RIE process may be used to open apertures in the Cr layer. A different process may then be used to open apertures in the second mask layer, and a different RIE process may be used to open apertures in the first mask layer. Other materials besides SiOx and Cr may be used to form the bilayer transfer layer.

Other embodiments of the method of fabricating a workpiece (e.g., magnetic media) may comprise providing one or more layers, including a magnetic layer, on a substrate; masking portions of a layer furthest from the substrate with an ion implantation mask comprising two or more layers including a first mask layer closer to the substrate, and a second mask layer on the first mask layer and further from the substrate; and ion implanting one or more of the layers on the substrate to form portions with altered properties (e.g., magnetic) from the layers under the mask to form a plurality of altered regions (e.g., altered or non-magnetic) corresponding to a plurality of apertures in the mask.

The mask may have a total thickness of about 5 nm to about 70 nm, and each of the first and second mask layers may have a thickness of about 1 nm to about 40 nm. The mask may consist of a bi-layer of the first mask layer and the second mask layer, the first mask layer comprises a metal selected from the group consisting of Mo, W and Cr, and the second mask layer comprises carbon, and the carbon contains elements selected from H or N. The second mask layer may comprise filtered cathodic carbon (FCAC), facing-target deposited carbon, confined dense plasma source (CPS) carbon, diamond-like carbon (DLC) or amorphous carbon.

An imprint resist layer may be located beyond the second mask layer; and an adhesion layer may be located between the imprint resist layer and the second mask layer; or a pattern transfer layer between the imprint resist layer and the second mask layer. The portions with altered physical properties may have a thickness about 2 nm to about 25 nm; and the mask may cause patterning in the one or more of the layers on the substrate, and widths of the portions with altered physical properties are about 2 nm to about 25 nm. The implanting ions may comprise As, Sb, P, Cr, Ga, B, O, or N; and a dose of the ion implanting is about $0.5 \times 10^{16}$ ions/cm$^2$ to about $3 \times 10^{16}$ ions/cm$^2$, or about $1 \times 10^{16}$ ions/cm$^2$ to about $2 \times 10^{16}$ ions/cm$^2$. One or more reactive ion etch (RIE) steps may be used to remove the mask after ion implantation is completed.

The resulting implanted region may have portions of the workpiece layer with higher concentrations of implanted ions that have more defects than portions with lower doses of implanted ions. Alternatively, the portions of the workpiece layer with higher concentrations of implanted ions may be amorphous and other portions of the workpiece layer with lower doses of implanted ions may be crystalline.

In still other embodiments, a magnetic media may comprise one or more layers, including a magnetic layer, on a substrate; a first mask material on the one or more layers closer to the substrate, a second mask material on the first mask material and further from the substrate, and at least one of the first and second mask materials may be present in an amount of about 0.001 at % and about 10 at %; the magnetic layer has magnetic regions beneath the first and second mask materials; and the magnetic layer has non-magnetic regions adjacent the first and second mask materials. The at least one of the first and second mask materials (or both) may present in an amount of about 0.05 at % and about 5 at %.

Thus, residual or trace amounts of mask material may still be present and detectable on the final finished product of the magnetic media. Equipment may be used to detect whether mask material is in the implanted or non-implanted regions of the magnetic layer. For example, a detectivity of about 0.001% is achievable with SIMS detection. However, SIMS may not have the necessary spatial resolution to tell whether mask material is in the implanted or non-implanted regions of the magnetic layer. TEM microanalysis has the necessary spatial resolution but may be limited to detection below about 0.1 at %. However, TEM microanalysis may still be suitable with care and suitable averaging.

More generally, a write head is used to direct the magnetic state of the magnetic bits to one of two directions to write data. The resting state of the magnetization of the bit can be pointed perpendicular to the plane of the disk. A read head is used to detect which direction the magnetization is pointed in. Typically the read and write heads are integrated on a single slider and the slider is attached to a suspension which is rotated to different radii on the disk to read and write information from various tracks. The read head is also uses to control servo positioning of the head.

Embodiments of a read/write slider 110 having read/write heads may be moved across the disk surface by an actuator assembly 106, allowing the slider 110 to read and/or write magnetic data to a particular track 113. The actuator assembly 106 may pivot on a pivot 114 or by a linear actuator. The actuator assembly 106 may form part of a closed loop feedback system, known as servo control, which dynamically positions the read/write slider 110 to compensate for thermal expansion of the magnetic recording media 111 as well as vibrations and other disturbances or irregularities. Also involved in the servo control system is a complex computational algorithm executed by a microprocessor, digital signal processor, or analog signal processor 116 that receives data address information from a computer, converts it to a location on the disk 111, and moves the read/write slider 110 accordingly.

In some embodiments of hard disk drive systems, read/write sliders 110 periodically reference servo patterns recorded on the disk to ensure accurate slider positioning. Servo patterns may be used to ensure a read/write slider 110 follows a particular track 113 accurately, and to control and monitor transition of the slider 110 from one track to another. Upon referencing a servo pattern, the read/write slider 110 obtains head position information that enables the control circuitry 116 to subsequently realign the slider 110 to correct any detected error.

Servo patterns or servo sectors may be contained in engineered servo sections 112 that are embedded within a plurality of data tracks 113 to allow frequent sampling of the servo patterns for improved disk drive performance, in some embodiments. In a typical magnetic recording media 111, embedded servo sections 112 may extend substantially radially from the center of the magnetic recording media 111, like spokes from the center of a wheel. The servo features may be similarly sized to the data features or may be larger. The size of the features is determined by the mask pattern. Unlike spokes however, servo sections 112 form a subtle, arc-shaped path calibrated to substantially match the range of motion of the read/write slider 110. These servo patterns also may be created by the ion implantation patterning process. Both sides of the disk can be patterned.

This written description uses examples to disclose the embodiments, including the best mode, and also to enable those of ordinary skill in the art to make and use the invention. The patentable scope is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

Note that not all of the activities described above in the general description or the examples are required, that a portion of a specific activity may not be required, and that one or more further activities may be performed in addition to those described. Still further, the orders in which activities are listed are not necessarily the order in which they are performed.

In the foregoing specification, the concepts have been described with reference to specific embodiments. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of invention.

As used herein, the terms "comprises," "comprising," "includes," "including," "has," "having" or any other variation thereof, are intended to cover a non-exclusive inclusion. For example, a process, method, article, or apparatus that comprises a list of features is not necessarily limited only to those features but may include other features not expressly listed or inherent to such process, method, article, or apparatus. Further, unless expressly stated to the contrary, "or" refers to an inclusive-or and not to an exclusive-or. For example, a condition A or B is satisfied by any one of the following: A is true (or present) and B is false (or not present), A is false (or not present) and B is true (or present), and both A and B are true (or present).

Also, the use of "a" or "an" are employed to describe elements and components described herein. This is done merely for convenience and to give a general sense of the scope of the invention. This description should be read to include one or at least one and the singular also includes the plural unless it is obvious that it is meant otherwise.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

After reading the specification, skilled artisans will appreciate that certain features are, for clarity, described herein in the context of separate embodiments, may also be provided in combination in a single embodiment. Conversely, various features that are, for brevity, described in the context of a single embodiment, may also be provided separately or in any subcombination. Further, references to values stated in ranges include each and every value within that range.

What is claimed is:

1. A method of fabricating a mask structure, comprising: providing a mask comprising two or more film layers; providing a first mask layer having a first etch rate from exposure to ions incident on the first mask layer; providing a second mask layer having a second etch rate that is lower than the first etch rate from exposure to ions incident on the second mask layer; providing apertures through portions of the first and second mask layers to provide a patterned mask structure; putting the patterned mask structure on a workpiece comprising one or more film layers on a subtrate; and the first mask layer is closer to both the workpiece and the subtrate than the second mask layer, the patterned mask structure is on a layer of a workpiece, portions of the workpiece layer are under the apertures, and implanting ions in the portions of the workplace layers alters a property of the portions of the workpiece layer.

2. A method according to claim 1, wherein the portions of the workpiece layer below the apertures have a higher concentration of implanting ions compared to portions of the workpiece layer between the apertures.

3. A method according to claim 1, wherein an atomic concentration of ions implanted in the portions of the workpiece layer below the apertures is between 0.1 at % and 10 at %.

4. A method according to claim 1, wherein the implanted ions comprise one or more of As, Sb, P, Cr, Ga, B, O and N.

5. A method according to claim 1, wherein the layers on the substrate comprise a magnetic layer, the implanted ions alter magnetic properties of the portions of the magnetic layer to form a plurality of non-magnetic regions corresponding to the apertures in the patterned mask structure.

6. A method according to claim 1, wherein the workpiece comprises a magnetic medium of a magnetic memory device, a flexible tape substrate, a magnetoresistive random access memory (MRAM) device, a phase change memory, a semiconductor, flash memory, a dynamic random access memory (DRAM).

7. A method according to claim 1, further comprising one or more etch steps to remove the patterned mask structure after an ion implantation is completed.

8. A method according to claim 1, further comprising a pattern transfer layer between the first and second mask layers and the thickness of the pattern transfer layer is between about 0.2 nm and about 20 nm.

9. A method according to claim 8, wherein the pattern transfer layer comprises Cr, Si, O, N, $SiO_x$, or $SiN_x$.

10. A method according to claim 1, wherein a total thickness of the patterned mask structure is about 4 nm to about 70 nm, and each of the first and second mask layers has a thickness of about 1 nm to about 40 nm.

11. A method according to claim 1, wherein the first mask layer contains atoms that have a first atomic number and a first atomic mass, and the second mask layer contains atoms that have a second atomic number and a second atomic mass that are lower than the first atomic number and the first atomic mass, respectively.

12. A method according to claim 1, wherein the first mask layer comprises a material selected from the group consisting of W, Mo and Cr.

13. A method according to claim 1, wherein the second mask layer contains C.

14. A method according to claim 1, wherein the second mask layer comprises Si and one or more of O and N, or the second mask layer comprises Ti and one or more of N and O.

15. A method according to claim 1, further comprising a patterned resist layer beyond the second mask layer.

16. A method according to claim 15, further comprising:
an adhesion layer between the patterned resist layer and the second mask layer; or
one or more pattern transfer layers between the patterned resist layer and the second mask layer.

17. A method of fabricating a workpiece, comprising:
providing one or more layers on a substrate;
masking portions of a layer furthest from the substrate with an ion implantation mask comprising two or more layers including a first mask layer closer to the substrate, and a second mask layer on the first mask layer and further from the substrate; and
ion implanting one or more of the layers on the substrate to form portions with altered properties from the layers under the mask to form a plurality of altered regions corresponding to a plurality of apertures in the mask; and
the mask has a total thickness of about 5 nm to about 70 nm, and each of the first and second mask layers has a thickness of about 1 nm to about 40 nm.

18. A method according to claim 17, wherein the mask consists of a bi-layer of the first mask layer and the second mask layer, the first mask layer comprises a metal selected from the group consisting of Mo, W and Cr, and the second mask layer comprises carbon, and elements selected from H or N.

19. A method according to claim 17, wherein the second mask layer comprises filtered cathodic carbon (FCAC), facing-target deposited carbon, confined dense plasma source (CPS) carbon, diamond-like carbon (DLC) or amorphous carbon.

20. A method according to claim 17, further comprising an imprint resist layer beyond the second mask layer; and
   an adhesion layer between the imprint resist layer and the second mask layer; or
   a pattern transfer layer between the imprint resist layer and the second mask layer.

21. A method according to claim 17, wherein the workpiece is magnetic media, and the portions with altered properties have a thickness about 1 nm to about 100 nm; and
   the mask causes patterning in the one or more of the layers on the substrate, and widths of the portions with altered properties are about 2 nm to about 25 nm.

22. A method according to claim 17, wherein the implanting ions comprise As, Sb, P, Cr, Ga, B, O, or N;
   a dose of the ion implanting is about $0.5 \times 10^{16}$ ions/cm$^2$ to about $3 \times 10^{16}$ ions/cm$^2$, or about $1 \times 10^{16}$ ions/cm$^2$ to about $2 \times 10^{16}$ ions/cm$^2$; and further comprising one or more etch steps to remove the mask after ion implantation is completed.

23. A method of fabricating a workpiece, comprising: providing one or more layers on a substrate;
   masking portions of a layer furthest from the substrate with an ion implantation mask comprising two or more layers including a first mask layer closer to the substrate, and a second mask layer on the first mask layer and further from the substrate;
   ion implanting one or more of the layers on the substrate to form portions with altered properties from the layers under the mask to form a plurality of altered regions corresponding to a plurality of apertures in the mask; and
   the second mask layer comprises filtered cathodic carbon (FCAC), facing-target deposited carbon, confined dense plasma source (CPS) carbon, diamond-like carbon (DLC) or amorphous carbon.

24. A method according to claim 23, wherein the mask consists of a bi-layer of the first mask layer and the second mask layer, the first mask layer comprises a metal selected from the group consisting of Mo, W and Cr, and the second mask layer comprises carbon, and elements selected from H or N.

25. A method according to claim 23, further comprising an imprint resist layer beyond the second mask layer; and
   an adhesion layer between the imprint resist layer and the second mask layer; or
   a pattern transfer layer between the imprint resist layer and the second mask layer.

26. A method according to claim 23, wherein the workpiece is magnetic media, and the portions with altered properties have a thickness about 1 nm to about 100 nm; and
   the mask causes patterning in the one or more of the layers on the substrate, and widths of the portions with altered properties are about 2 nm to about 25 nm.

27. A method according to claim 23, wherein the implanting ions comprise As, Sb, P, Cr, Ga, B, O, or N;
   a dose of the ion implanting is about $0.5 \times 10^{16}$ ions/cm$^2$ to about $3 \times 10^{16}$ ions/cm$^2$, or about $1 \times 10^{16}$ ions/cm$^2$ to about $2 \times 10^{16}$ ions/cm$^2$; and further comprising
   one or more etch steps to remove the mask after ion implantation is completed.

\* \* \* \* \*

UNITED STATES PATENT AND TRADEMARK OFFICE
CERTIFICATE OF CORRECTION

PATENT NO. : 8,906,706 B2  
APPLICATION NO. : 13/415659  
DATED : December 9, 2014  
INVENTOR(S) : Patel et al.

Page 1 of 1

It is certified that error appears in the above-identified patent and that said Letters Patent is hereby corrected as shown below:

Claims

Column 9, claim 1, line 55; please delete "subtrate", and insert --substrate--

Column 9, claim 1, line 58; please delete "workplace", and insert --workpiece--

Column 11, claim 22, line 24; please insert a space between "cm squared" and "to"

Signed and Sealed this  
Twenty-second Day of September, 2015

Michelle K. Lee  
*Director of the United States Patent and Trademark Office*